(12) United States Patent
Yamamoto (10) Patent No.: US 6,630,374 B2
(45) Date of Patent: Oct. 7, 2003

(54) RESIN SEALING METHOD AND RESIN SEALING APPARATUS

(75) Inventor: Saburo Yamamoto, Kyoto (JP)

(73) Assignee: Towa Corporation, Kyoto (JP)

( * ) Notice: Subject to any disclaimer, the term of this patent is extended or adjusted under 35 U.S.C. 154(b) by 0 days.

(21) Appl. No.: 09/760,157

(22) Filed: Jan. 11, 2001

(65) Prior Publication Data

US 2001/0008775 A1 Jul. 19, 2001

(30) Foreign Application Priority Data

Jan. 19, 2000 (JP) ........................................ 2000-009773

(51) Int. Cl.⁷ ............................ H01L 21/44; H01L 21/50
(52) U.S. Cl. ........................ 438/124; 438/127; 438/106
(58) Field of Search ............................. 438/106, 108, 438/122, 124, 127

(56) References Cited

U.S. PATENT DOCUMENTS 6,048,483 A  *  4/2000  Miyajima ............... 264/272.14

FOREIGN PATENT DOCUMENTS

| EP | 0665584 | * | 8/1995 |
| EP | 0933808 | * | 8/1999 |
| JP | 2000311908 | * | 4/1999 |

* cited by examiner

Primary Examiner—Amir Zarabian
Assistant Examiner—Pamela Perkins
(74) Attorney, Agent, or Firm—W.F. Fasse; W.G. Fasse (57) ABSTRACT

A lead frame is placed on a lower mold with its non-mounting surface facing upward. An unused portion of a resin tape is supplied between the upper mold and the lower mold. The resin tape is sucked to the upper mold and preheated. A molten resin is injected into a cavity for curing, with the upper and lower molds closed together, and with the lead frame positioned loosely without being tightly clamped between the upper and lower molds. The injected resin presses the lead frame against the resin tape on the upper mold surface. Thus, resin sealing is performed. In this method, the resin tape is kept in close contact with the non-mounting surface of the lead frame and held in a space of the lead frame for resin sealing, so that formation of a cured resin on the bottom surface of the package can be prevented.

16 Claims, 5 Drawing Sheets

RESIN SEALING METHOD AND RESIN SEALING APPARATUS

BACKGROUND OF THE INVENTION

1. Field of the Invention

The present invention relates to a resin sealing method and apparatus for forming a package by sealing a lead frame with an electronic part such as a semiconductor chip with a resin.

2. Description of the Conventional Art

In recent years, the demands for miniaturization of an electronic device such as a portable device have been on the increase. To meet such demands, packages are rapidly reduced in size and weight. Small packages with a flat bottom surface and an external electrode on its side, called a QFN (Quad Flat Non-leaded), are widely used.

Now, a conventional method of manufacturing a QFN package will be described. First, a semiconductor chip is placed on a die pad of a lead frame, and the pads of the semiconductor chip and the lead frame are bonded by a wire. Then, the lead frame with the semiconductor chip is placed on a lower mold. With the semiconductor chip received in a cavity of an upper mold, the upper and lower molds are closed and the lead frame is clamped. Then, a molten resin is poured into the cavity for curing. Thereafter, the molds are opened and a resin mold part, having the integrated semiconductor chip, lead frame and cured resin, is removed, and a package is completed by punching. In the completed package, the external electrode is exposed from the side and lower surface of the cured resin. As such, the QFN package has an advantage of a reduced area or real estate since the lead is inside the package when viewed from above.

However, in the above described conventional manufacturing method, the cured resin may protrude from the bottom surface of the package which should be flat, as a result of resin sealing. Such cured resin may be formed by the following process. Namely, due to foreign matters adhering to the mold face of the lower mold, the lower surface of the lead frame and the like, or a slight curve or swelling of the lead frame, a space is formed between the mold face of the lower mold and the lower surface of the lead frame. If the molten resin pours onto the lower surface of the lead frame through the space between the lead frame and the lead or between the lead and the die pad, a protrusion of the cured resin is formed on the bottom surface of the package. If the lead frame has a slight curve, swelling or the like, the clamping of the lead frame by the upper and lower molds may cause a space between the lower mold and lead frame, disadvantageously allowing a protrusion of the cured resin on the bottom surface of the package.

This results in deterioration of physical appearance and lifting of the package when mounting the package onto a printed circuit board or the like. Consequently, the reliability of an electrical connection between the external electrode of the package and the pad of the printed circuit board decreases and an overall height of the printed circuit board with the mounted package (hereinafter defined as a package mounting height) increases, thereby preventing miniaturization of electronic devices.

To prevent formation of the cured resin protrusion on the bottom surface of the package, a lead frame is used which has a tape on its lower surface. However, this involves more cost. In addition, when the lead frame on a mold is heated by the mold, the difference between the lead frame and the tape in thermal expansion coefficient leads to a curved lead frame, whereby the formation of the cured resin protrusion on the bottom surface of the package cannot be avoided.

SUMMARY OF THE INVENTION

An object of the present invention is to provide a resin sealing method and apparatus capable of forming a package with enhanced physical appearance and reliability of an electrical characteristic while restricting a package mounting height by preventing formation of a cured resin protrusion on a bottom surface of the package.

In one aspect, the resin sealing method of the present invention to achieve the above mentioned object refers to a method of sealing a semiconductor chip having a lead frame on its one surface with a resin with use of a mold for resin sealing. The method includes steps of: supplying and setting the lead frame in a prescribed position at a mold face of the mold and enclosing the semiconductor chip on the lead frame in a cavity formed in the mold face of the mold; providing a film with a required heat resistance and elasticity between the opposing mold faces of the mold and applying the film onto the mold face of the opposing mold faces on the other surface side of the lead frame; closing the opposing mold faces of the mold; sealing the semiconductor chip in the cavity with a resin by pouring a molten resin material into the cavity after the closing step; opening the mold and removing a mold part after the resin sealing step; and removing the film. The lead frame has a required degree of freedom i.e., it is not subjected to a pressure from the opposing mold faces of the mold when closing the mold. During resin sealing, the other surface of the lead frame is kept tightly in contact with the film applied to the other surface under a pressure of pouring the molten resin material into the cavity.

In this method, a film is kept in contact with a surface of the lead frame without the semiconductor chip, i.e., a non-mounting surface, for the purpose of preventing a molten resin from pouring onto the non-mounting surface. In addition, foreign matters are prevented from adhering to the film and lead frame. Further, the problem associated with small wrinkles of the film or a curved lead frame is eliminated. Thus, a cured resin protrusion on the bottom surface of the package would not be formed.

In addition, since the side surface of the lead frame on the non-mounting surface side is exposed from the cured resin, adhesion strength in mounting the package onto a printed circuit board and the like increases, thereby facilitating visual inspection.

Therefore, the present invention effectively provides a resin sealing method and apparatus with enhanced appearance and reliability capable of preventing formation of a cured resin protrusion on the bottom surface of the package, restricting a package mounting height, and providing greater adhesion strength in mounting.

In another aspect, the resin sealing method of the present invention refers to a method of sealing a lead frame with a semiconductor chip with a resin with use of opposing upper and lower molds. The method is characterized in that it includes steps of: supplying a resin tape between the upper and lower molds from a supplying roll to a receiving roll; applying the resin tape onto the mold face of the upper mold; placing the lead frame on the mold face of the lower mold with the semiconductor chip received in the cavity of the lower mold; closing the upper and lower molds while preventing the lead frame from being held between the upper and lower molds; pouring a molten resin into the cavity and pressing the lead frame against the upper mold through the resin tape by the poured molten resin; curing the molten resin to provide a cured resin; opening the upper and lower molds; removing a resin mold part with the cured resin and lead frame integrated together; and supplying unused portion of the resin tape between the upper and lower molds while receiving onto the receiving roll used portion of the resin tape, with use of the receiving and supplying rolls.

In the method, a surface of the lead frame without the semiconductor chip, i.e., a non-mounting surface, is pressed against the upper mold by the molten resin through the resin tape, so that an opening used for pouring the molten resin onto the non-mounting surface is closed and the resin tape is compressed and deformed. Since newly supplied resin tape covers the non-mounting surface of the lead frame, foreign matters are less likely to adhere to the surfaces of the resin tape and lead frame. Consequently, formation of the space between the resin tape and the lead frame due to the curving of the lead frame, slight swelling and foreign matters as well as pouring of the molten resin onto the non-mounting surface of the lead frame can be prevented. Thus, a cured resin protrusion would not be formed on the bottom surface of the package. In addition, the side surface of the lead frame on the non-mounting side is exposed from the cured resin since a part of the deformed resin tape is held between the lead frames or between the lead and the die pad.

In still another aspect, a resin sealing method of the present invention refers to a method of sealing a lead frame with a semiconductor chip with a resin with use of opposing upper and lower molds. The method is characterized in that it includes steps of: supplying a resin tape from a supplying roll to a receiving roll between the upper and lower molds; applying the resin tape onto the mold face of the lower mold; placing the lead frame on the lower mold through the resin tape to provide the semiconductor chip directly below the cavity of the upper mold; closing the upper and lower molds while preventing the lead frame from being held between the upper and lower molds; pouring a molten resin into the cavity and pressing the lead frame against the lower mold through the resin tape by the poured molten resin; curing the molten resin to form a cured resin; opening the upper and lower molds; removing a resin mold part with the resin mold and lead frame integrated together; and supplying unused portion of resin tape between the upper and lower molds while receiving used portion of the resin tape onto the receiving roll, with use of the receiving and supplying rolls.

In the method, since the non-mounting surface of the lead frame is pressed against the lower mold by the molten resin through the resin tape, the resin tape is compressed and deformed and an opening allowing the molten resin to pour onto the non-mounting surface is closed. Further, the lead frame is provided with its non-mounting surface facing down above the newly supplied resin tape, whereby foreign matters are less likely to adhere to the surfaces of the resin tape and lead frame. Thus, formation of a space between the resin tape and the lead frame due to the curving, slight swelling and foreign matters of the lead frame as well as the pouring of the molten resin onto the non-mounting surface of the lead frame can be prevented. Thus, a cured resin protrusion would not be formed on the bottom surface of the package. In addition, since a part of the deformed resin tape is held between the leads or between the lead and die pad, the side surface of the lead frame on the non-mounting side is exposed from the cured resin.

The resin sealing method of the present invention is characterized in that the resin tape is preheated by the preheated upper or lower mold in the step of applying the resin tape.

In this method, the lead frame is pressed against the resin tape, which has been thermally expanded due to preheating. Thus, the problem of curving due to a difference in thermal expansion coefficient when the resin tape and lead frame are preliminary applied can be eliminated.

The resin sealing of the present invention is characterized in that the resin tape is an adhesive tape having a base layer and an adhesion layer, the lead frame is pressed against the adhesion layer in the pressing step, and the adhesion tape is removed from the lead frame in or after the opening step.

In this method, adhesion between the adhesive tape and lead frame can be enhanced by the adhesion layer. Thus, the formation of the space therebetween as well as an opening allowing the molten resin to pour onto the non-mounting surface can be more reliably prevented, so that a cured resin protrusion would not be formed on the bottom surface of the package. In addition, since the adhesion layer adheres to the side surface of the lead frame on the non-mounting side, the surface of the lead frame on the non-mounting side is exposed from the cured resin.

The resin sealing method of the present invention is characterized in that it further includes a step of evacuating the space between the upper and lower molds.

In this method, foreign matters are discharged with air through a space between the upper and lower molds, so that adhesion of foreign matters to the surfaces of the resin tape and the lead frame is more reliably prevented, and a cured resin protrusion would not be formed on the bottom surface of the package.

The resin sealing method of the present invention is characterized in that a plurality of semiconductor chips are mounted to the lead frame, a plurality of cavities are provided in the upper mold or the lower mold, the molten resin is poured into the plurality of cavities in the pressing step, and the lead frame is pressed against the resin tape by the molten resin poured into the cavity.

In the method, the molten resin is poured into a plurality of cavities each including a semiconductor chip, whereby the plurality of semiconductor chips are collectively subjected to resin sealing with respect to the lead frame to provide increased workability of resin sealing.

A resin sealing apparatus of the present invention seals with a resin a lead frame placed between upper and lower molds of a mold and having on its one surface a semiconductor chip. The resin sealing apparatus is characterized in that it includes: a means for providing a resin tape between the upper and lower molds; a means for enclosing the semiconductor chip in the cavity of the mold with the other surface of the lead frame in contact with the resin tape and closing the upper and lower molds while preventing the lead frame from being held therebetween; a means for pouring a molten resin into the cavity; a means for closing the upper and lower molds with the poured molten resin cured, where the means for pouring the molten resin presses the other surface of the lead frame against the mold through the resin tape by the poured molten resin.

In the apparatus, the other surface of the lead frame, i.e., a non-mounting surface, is pressed indirectly against the mold by the molten resin with the resin tape therebetween, so that an opening allowing the molten resin to pour onto the non-mounting surface is closed and the resin tape is compressed and deformed. In addition, since the applied resin tape and the non-mounting surface of the lead frame are opposite to each other, foreign matters are less likely to adhere to the surfaces of the resin tape and the lead frame. Thus, formation of a space between the resin tape and lead frame due to the curving, slight swelling and foreign matters of the lead frame as well as the pouring of the molten resin onto the non-mounting surface of the lead frame can be prevented. Thus, a cured resin protrusion would not be formed on the bottom surface of the package. In addition, since a part of the deformed resin tape is held between the leads or between the lead and the die pad, the side surface of the lead frame on the non-mounting surface side is exposed from the cured resin.

The resin sealing apparatus of the present invention is characterized in that it further includes a means for evacuating the space between the upper and lower molds.

With the apparatus, foreign matters are discharged with air, so that adhesion of foreign matters to the surfaces of the lead frame and resin tape is more reliably prevented. Thus, a cured resin protrusion would not be formed on the bottom surface of the package.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

The first embodiment of the present invention will be described with reference to FIGS. 1A to 2C.

Figure 1A:
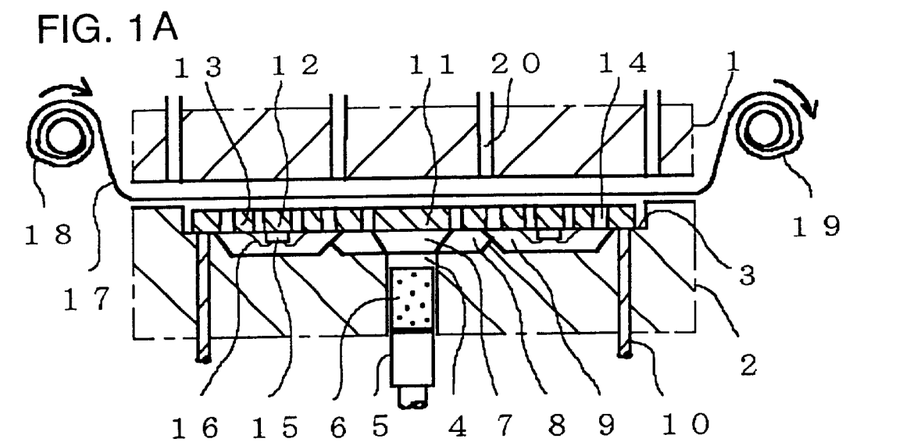
FIGS. 1A to 1C are partial cross sections respectively showing steps of supplying a resin tape, applying and fixing the supplied resin tape to an upper mold, and closing the molds and pouring a molten resin of a resin sealing method of the first embodiment.
Figure 1B:
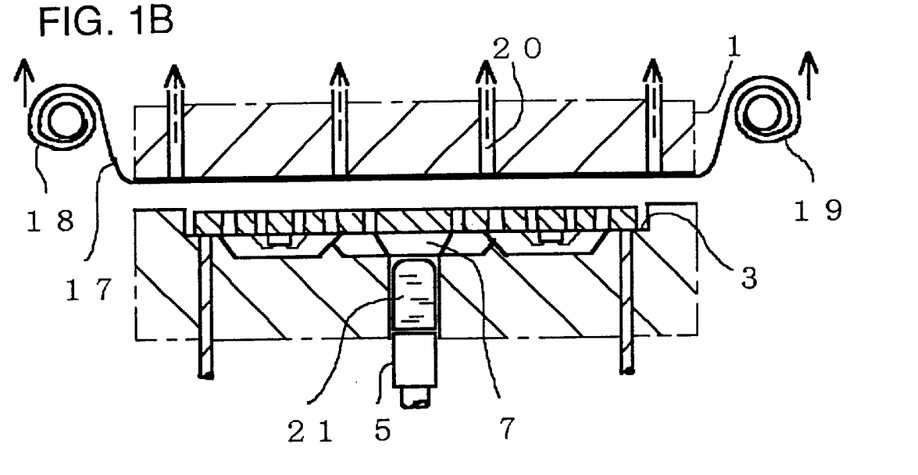
Figure 1C:
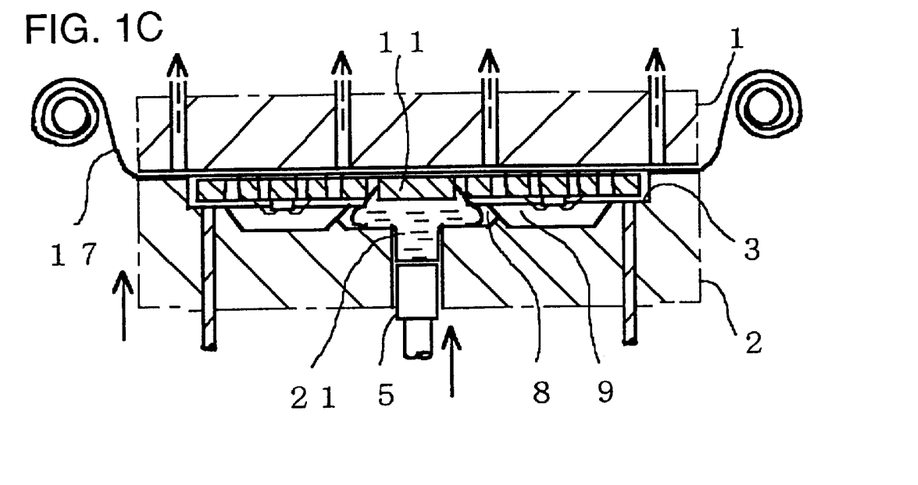

First, a resin sealing apparatus of the present embodiment is described with reference to FIGS. 1A to 1C. Referring to FIGS. 1A to 1C, an upper mold 1 and a lower mold 2 are heated by a heater (not shown). Lower mold 2 has a recess 3 and a pot 4, which has a vertically movable plunger 5. In pot 4, resin tablets 6 of, e.g., an epoxy resin, are provided on plunger 5. Lower mold 2 further has a cull 7 for storing a molten resin, i.e., molten resin tablet 6, a resin flowing portion 8 in which the molten resin flows, and a cavity 9 to be filled with the molten resin. An ejector pin 10, provided on the side of lower mold 2, is a projecting mechanism used for removal of a completed resin mold part from lower mold 2.

A lead frame 11, provided in recess 3 of lower mold 2, is for example an interconnection material of a metal such as a Cu based alloy or 42 alloy. Here, a depth of recess 3 of lower mold 2 is greater by a prescribed value, e.g., about 0.03 mm to 0.04 mm, than a thickness of lead frame 11. A die pad 12 is a part of lead frame 11, in which a semiconductor chip (later described) is placed. A bonding pad 13 is a part of lead frame 11, which is electrically connected to an electrode (not shown) of the semiconductor chip. A space 14 may be between bonding pads 13, between die pad and bonding pad 13, and between leads (not shown) extending from bonding pad 13, passing through lead frame 11. Semiconductor chip 15 placed on die pad 12 is a chip-like electronic part having semiconductor elements such as a number of transistors. A wire 16 is for example a metal line for electrically connecting the electrode of semiconductor chip 15 and bonding pad 13 of lead frame 11.

A resin tape 17 is for example of plastic such as polyimide (PI) or polytetrafluoroethylene (PTFE), which is in a strip and film like shape applied near upper mold 1. A supplying roll 18 has unused portion of resin tape 17 on a reel. A receiving roll 19 has used portion of resin tape 17 on the reel. A suction pipe 20 is connected to a vacuum mechanism having a valve (both are not shown), and used for sucking resin tape 17 to upper mold 1 as necessary.

Now, a resin sealing method of the present embodiment will be described with reference to FIGS. 1A to 2C. As shown in FIG. 1A, semiconductor chip 15 with lead frame 11 is placed in recess 3 of lower mold 2 with semiconductor chip 15 and wire 16 provided in cavity 9 of lower mold 2. Namely, lead frame 11 is placed with a surface of lead frame 11 without semiconductor chip 15, i.e., a non-mounting surface, facing upward. Thus, a surface of lead frame 11 with semiconductor chip 15, i.e., a mounting surface, is in contact with lower mold 2.

Further, a resin tablet 6 is introduced in pot 4, which is in turn heated by a heater (not shown) of lower mold 2 through lower mold 2. Further, by rotating supplying roll 18 and receiving roll 19, unused portion of resin tape 17 is supplied between upper mold 1 and lower mold 2.

Then, as shown in FIG. 1B, supplying roll 18 and receiving roll 19 are elevated to bring resin tape 17 closer to or in contact with a mold face of upper mold 1. Here, since a heater (not shown) preheats upper mold 1, resin tape 17 is preheated by heat radiated or transferred from the mold face of upper mold 1. Thereafter, resin tape 17 is fixed to the mold face of upper mold 1 with use of suction pipe 20. On the other hand, resin tablet 6 in pot 4 is heated to melt, so that a molten resin 21 is obtained.

Next, lower mold 2 is elevated for closing upper mold 1 and lower mold 2. As stated previously, recess 3 of lower mold 2 has a depth about 0.03 mm to 0.04 mm greater than a thickness of lead frame 11, so that upper mold 1 and lower mold 2 do not clamp lead frame 11. Thus, there is a step of about 0.03 mm to 0.04 mm between the non-mounting surface of lead frame 11 and resin tape 17. As shown in FIG. 1C, by elevating plunger 5, molten resin 21 is poured into cavity 9 through cull 7 and resin flowing portion 8. Thus, molten resin 21 pressed by plunger 5 in turn presses lead frame 11 against upper mold 1 through resin tape 17. In this case, a gap of about 0.03 mm to 0.04 mm is formed between the mold face (bottom face) of recess 3 and the mounting surface of lead frame 11, but molten resin 21 would not enter the gap because of its viscosity.

Figure 2A:
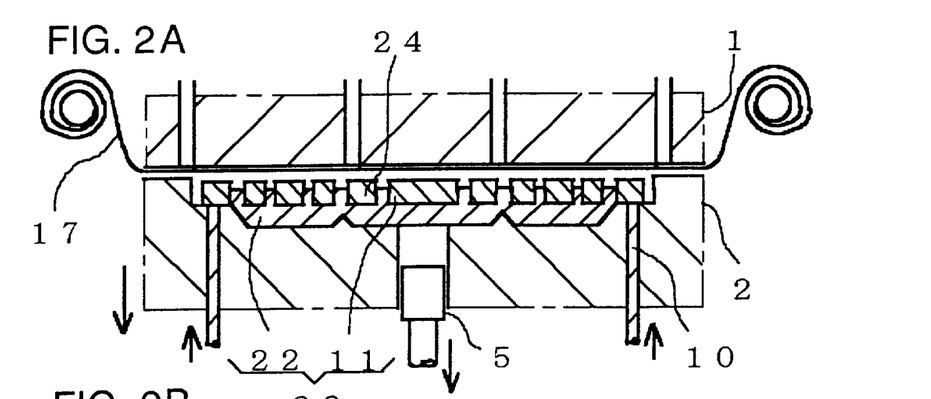
FIGS. 2A to 2C are partial cross sections respectively showing steps of opening the molds, removing a package, and supplying another lead frame of the resin sealing method of the first embodiment.
Figure 2B:
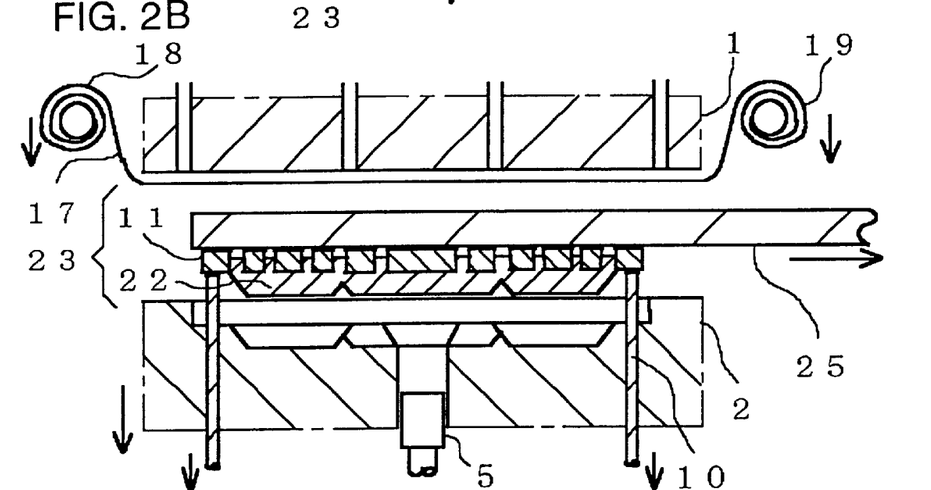
Figure 2C:
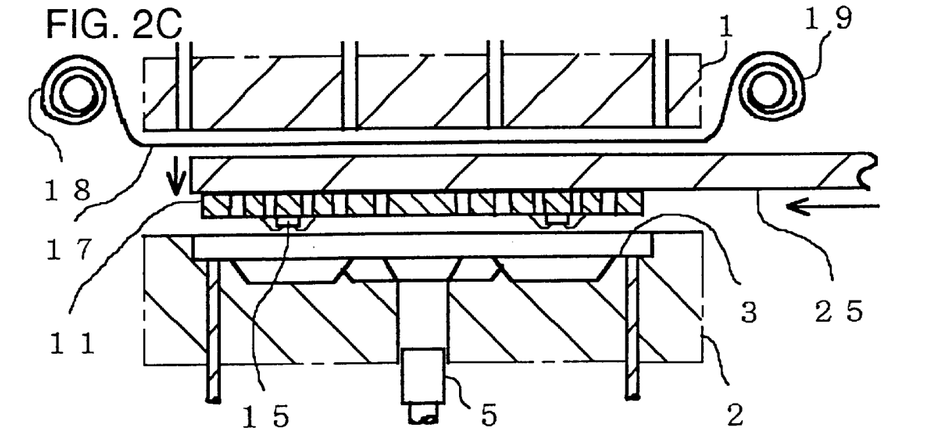

FIGS. 2A to 2C respectively show steps of opening the molds, removing a resin mold part, and supplying another lead frame of the resin sealing method of the present embodiment.

As shown in FIG. 2A, after the molten resin poured into cavity 9 of FIG. 1C is cured to form cured resin 22, lower mold 2 is lowered to separate upper mold 1 and lower mold 2 and an ejector pin 10 is elevated. Thus, resin mold part 23 including cured resin 22 cured in cull 7, resin flowing portion 8 and cavity 9 as well as lead frame 11 is ejected from lower mold 2. Here, external electrode 24 of lead frame 11 is a terminal electrically connected by means of, e.g., soldering, when mounting a package to the printed circuit board or the like.

As shown in FIG. 2B, supplying roll 18 and receiving roll 19 are lowered to separate resin tape 17 from upper mold 1, and a chuck 25 is introduced between upper mold 1 and lower mold 2. With use of a suction mechanism (not shown) provided in chuck 25, resin mold part 23 ejected by ejector pin 10 is sucked and transferred to a tray or the like. After the suction of resin mold part 23, ejector pin 10 is lowered back to its original position. The foregoing steps complete resin sealing of one lead frame 11.

Then, as shown in FIG. 2C, chuck 25 newly sucks lead frame 11 with semiconductor chip 15 and transfers it to a position directly above recess 3 of lower mold 2. After chuck 25 is lowered, it stops suction and places lead frame 11 in recess 3. Then, the step shown in FIG. 1A is repeated. Namely, by rotating supplying roll 18 and receiving roll 19, used portion of resin tape 17 is wound onto receiving roll 19 and unused portion of resin tape 17 is supplied between upper mold 1 and lower mold 2 from supplying roll 18.

Figure 3A:
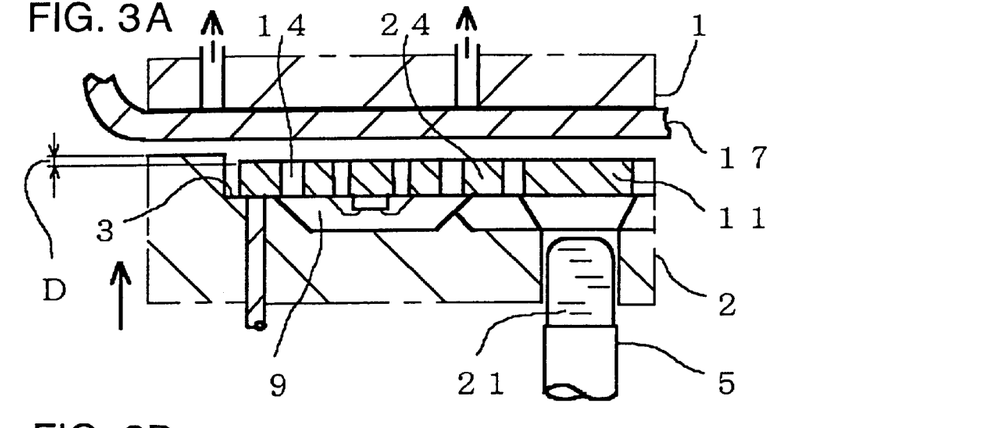
FIGS. 3A to 3C are partial cross sections respectively showing in enlargement steps of applying and fixing the resin tape to the upper mold, pouring the molten resin into the cavity after closing the molds and pressing the lead frame against the resin tape by the molten resin, and opening the molds for removal of a package of the resin sealing method of the first embodiment.
Figure 3B:
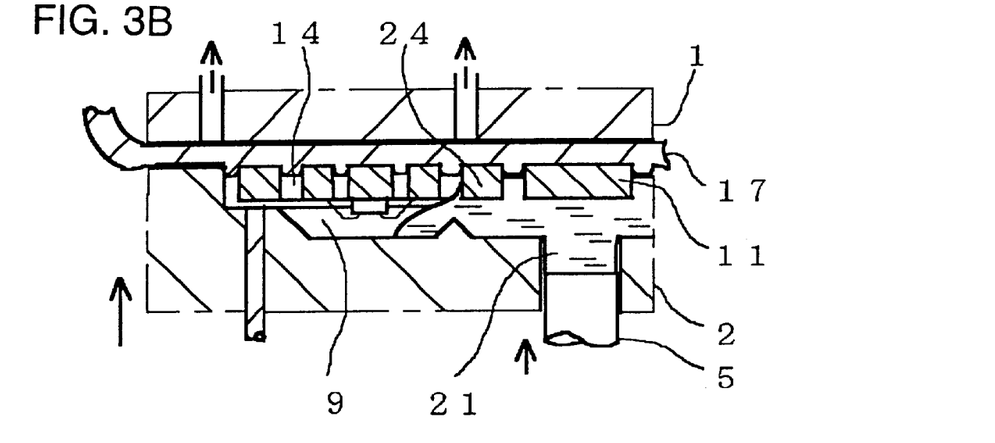
Figure 3C:
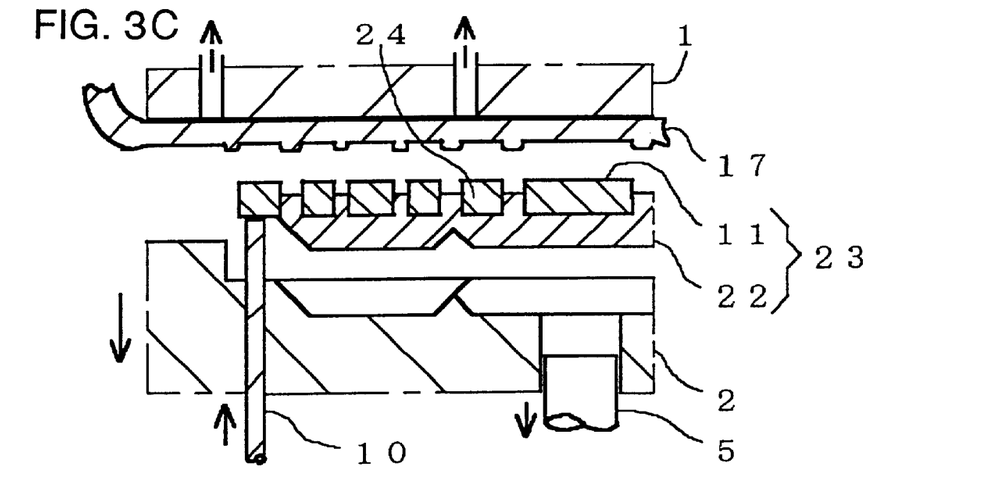

Now, the function of resin tape 17 of the present embodiment will be described with reference to FIGS. 3A to 3C. FIGS. 3A to 3C are partial cross sections respectively showing in enlargement steps of applying and fixing the resin tape to the upper mold, transferring molten resin to the cavity after closing the molds and pressing the resin tape against the lead frame by the molten resin, and opening the molds and removing a package.

As shown in FIG. 3A, lead frame 11 is placed in recess 3 of lower mold 2. Here, the non-mounting surface of lead frame 11 is lower than the upper surface of lower mold 2 by a step D of about 0.03 mm to 0.04 mm.

As shown in FIG. 3B, after closing the molds, plunger 5 is elevated to press molten resin 21. Thus, molten resin 21 pours into cavity 9 and pressed molten resin 21 in turn presses lead frame 11 against upper mold 1 through resin tape 17. Resin tape 17 is between upper mold 1 and lead frame 11, being pressed by molten resin 21 over almost the entire surface of lead frame 11. Thus, pressed resin tape 17 is compressed and deformed over almost the entire surface of lead frame 11, entering space 14 of lead frame 11.

As shown in FIG. 3C, after molten resin 21 is cured, the molds are separated and resin mold part 23 is ejected by ejector pin 10 from lower mold 2.

The function of resin tape 17 of the present embodiment is as follows. Pressed resin tape 17 is compressed and deformed to be closely in contact with the non-mounting surface of lead frame 11 and enters space 14 of lead frame 11. Thus, despite the slight curving or swelling of lead frame 11, if any, resin tape 17 tightly adheres to the non-mounting surface of lead frame 11, thereby closing the opening which allows molten resin 11 to pour onto the non-mounting surface.

Resin tape 17 enters space 14 in the non-mounting surface of lead frame 11, so that molten resin 21 does not reach the non-mounting surface. Thus, the side surface of external electrode 24 on the non-mounting surface side of lead frame 11, i.e., the side on which the package is mounted onto the printed circuit board or the like, is exposed from the cured resin after resin sealing.

The present embodiment is characterized in that resin tape 17 which is preheated and fixed to upper mold 1 is applied with a prescribed distance (which equals to step D) from the non-mounting surface of lead frame 11 with upper mold 1 and lower mold 2 closed together. In addition, instead of clamping lead frame 11, lead frame 11 is pressed against upper mold 1 through resin tape 17 by molten resin 21 poured into cavity 9.

Thus, at the non-mounting surface of lead frame 11, resin tape 17, which has been compressed and deformed by being pressed by the non-mounting surface, enters space 14. Thus, molten resin 21 transferring on the side of the mounting surface of lead frame 11 would not pour out onto the non-mounting surface from space 14.

Since lead frame 11 is not clamped, even if lead frame 11 has a curving or slight swelling, lead frame 11 pressed by molten resin 21 presses resin tape 17 and the pressed resin tape 17 is compressed and deformed, so that a space would not be formed between lead frame 11 and resin tape 17.

Because resin tape 17 covers the non-mounting surface of lead frame 11, foreign matters are less likely to adhere to the surfaces of lead frame 11 and resin tape 17. Thus, formation of a space due to the presence of foreign matters between upper mold 1 and lead frame 11 can be prevented.

After resin tape 17 applied over upper mold 1 is preheated by upper mold 1, upper mold 1 and lower mold 2 are closed through resin tape 17 which has already attained sufficient thermal expansion. Thus, as compared with the case where lead frame 11 is brought into close contact with resin tape 17 for closing and then heating, small wrinkles would not be formed in resin tape 17. In addition, as compared with the case where resin tape 17 is applied to lead frame 11 for heating, the curving of lead frame 11 can be prevented.

Consequently, formation of a cured resin protrusion on the non-mounting surface of lead frame 11, i.e., on the bottom surface of the completed package, is prevented.

Further, since a part of deformed resin tape 17 enters space 14 of lead frame 11, the side surface on the non-mounting side of external electrode 24 is exposed from cured resin 22. Thus, when mounting the package to a printed circuit board or the like, soldering adheres to the side surface of external electrode 24 of the package and the pad of a printed circuit board or the like in contact with external electrode 24. Accordingly, adhesion strength between external electrode 24 and pad increases, thereby facilitating visual inspection.

In addition, the resin tape needs not be preliminary applied to the non-mounting surface of lead frame 11, so that a material cost can be restrained.

Second Embodiment

Figure 4A:
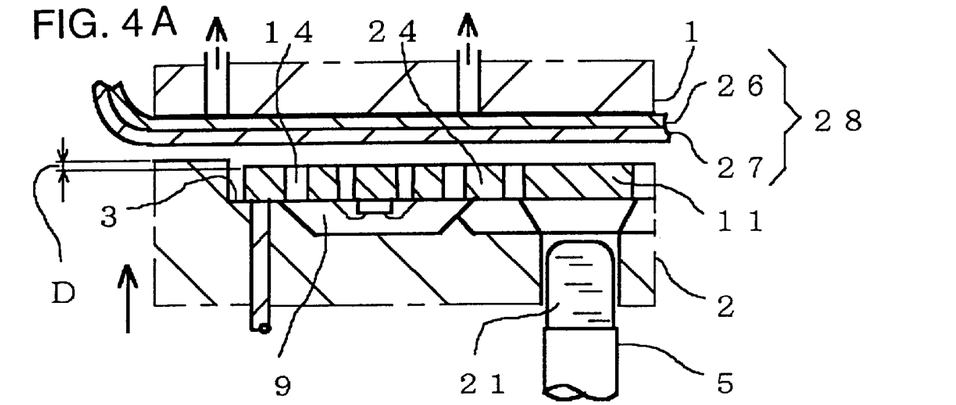
FIGS. 4A to 4C are partial cross sections respectively showing in enlargement steps of applying and fixing an adhesive tape to the upper mold, pouring a molten resin into a cavity after closing the molds and pressing the adhesive tape against the lead frame by the molten resin, and opening the molds for removal of a package of a resin sealing method of the second embodiment.
Figure 4B:
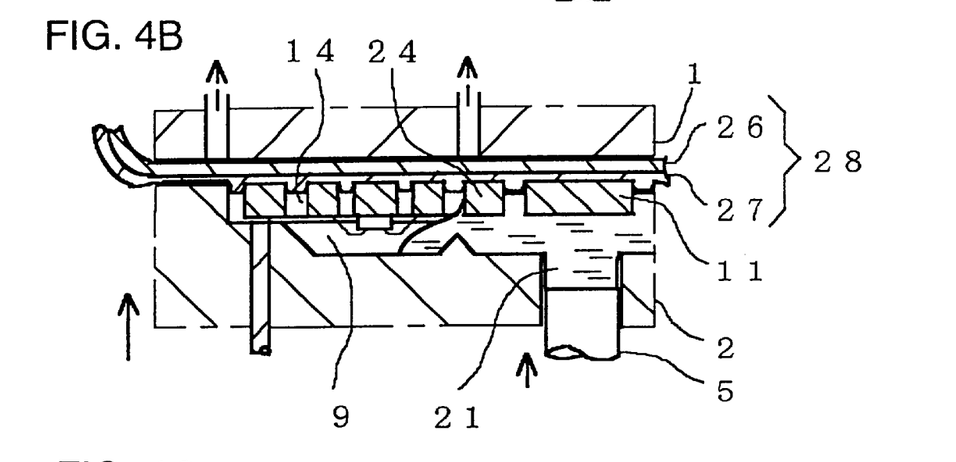
Figure 4C:
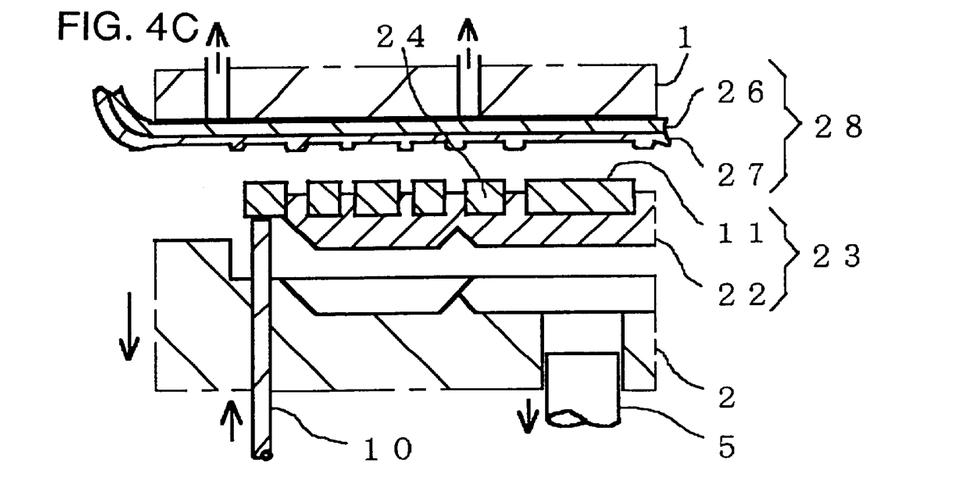

The second embodiment of the present invention will be described with reference to FIGS. 4A to 4C. In the present embodiment, an adhesive tape having a base layer and an adhesion layer is used as a resin tape. FIGS. 4A to 4C respectively show steps of applying and fixing the adhesive tape, pouring molten resin into a cavity after closing and pressing a lead frame against the adhesive tape by the molten resin, and opening the molds and removing a package.

In FIGS. 4A to 4C, base layer 26 includes, e.g., plastic such as polyimide (PI) or polytetrafluoroethylene (PTFE), being a resin material in a stripe and film like shape. Adhesion layer 27 is a soft adhesive material provided on base layer 26. Base layer 26 and adhesion layer 27 form adhesive tape 28.

In the present embodiment, as shown in FIGS. 4A to 4B, molten resin 21 presses lead frame 11 against adhesive tape 28 as in the first embodiment. Thus, the non-mounting surface of lead frame 11 is fixed to adhesion layer 27 and, further, adhesion layer 27 deforms at the non-mounting surface of lead frame 11 and enters space 14 of lead frame 11.

As shown in FIG. 4C, after molten resin 21 is cured to form cured resin 22, adhesive tape 28 is removed from resin mold part 23 by opening upper mold 1 and lower mold 2. Then, resin mold part 23 of lead frame 11 and cured resin 22 is ejected from lower mold 2 by ejector pin 10. The foregoing steps complete resin sealing of one lead frame 11.

Note that adhesive tape 28 may be removed from resin mold part 23 after resin mold part 23 is ejected from lower mold 2. In this case, for example, the side surface of ejected resin mold part 23 may be clamped by a transporting jig, used in place of chuck 25 of FIG. 2, for example, and the transporting jig is further lowered.

According to the present embodiment, adhesive tape 28 serves as resin tape 17 of the first embodiment.

In addition, adhesion layer 27 is reliably fixed to the non-mounting surface of lead frame 11. Thus, formation of a space between lead frame 11 and adhesive tape 28 is more reliably prevented.

As compared with the case where a part of resin tape 17 enters space 14 of lead frame 11 in the first embodiment, adhesion layer 27 of a soft adhesive material can enter space 14 more deeply. Thus, the side surface on the non-mounting side of external electrode 24 is exposed from cured resin 22 over a greater area. Thus, adhesion strength between external electrode 24 and a pad of a printed circuit board or the like further increases when mounting the package to a printed circuit board or the like.

Third Embodiment

Figure 5A:
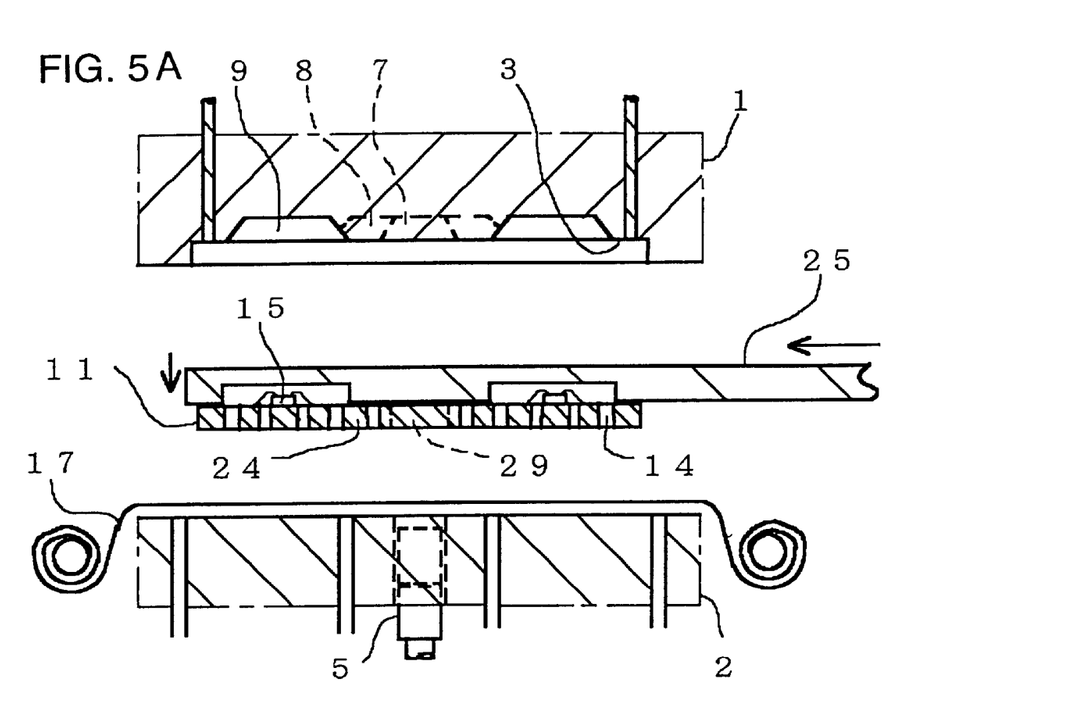
FIGS. 5A and 5B are partial cross sections respectively showing steps of supplying another lead frame, and forming and removing a package of a resin sealing method of the third embodiment.
Figure 5B:
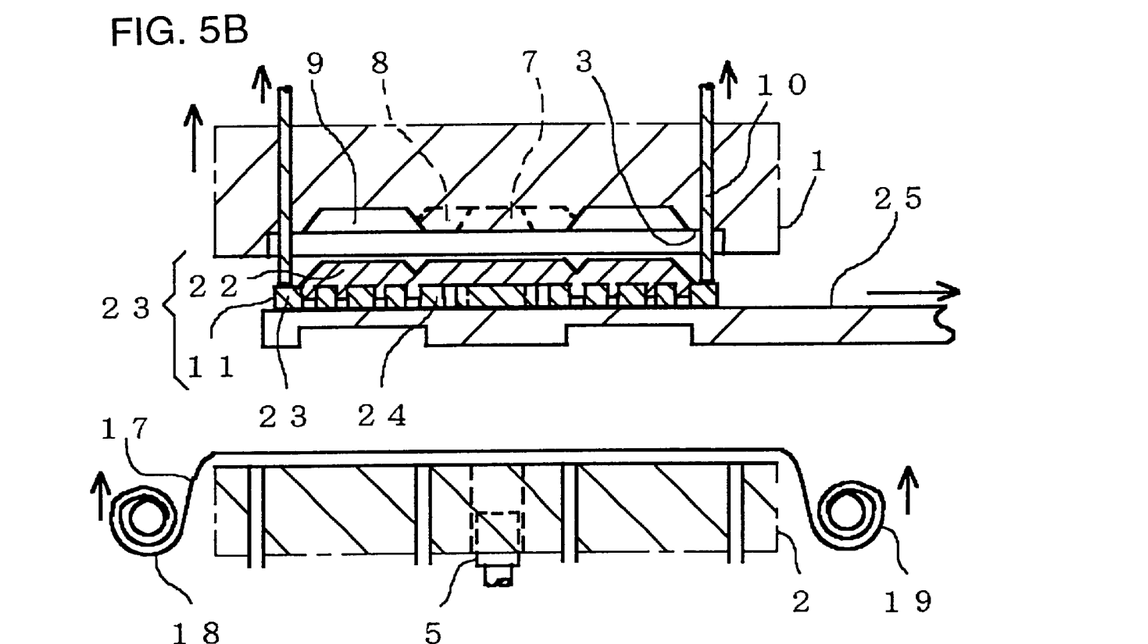

The third embodiment of the present invention will be described with reference to FIGS. 5A and 5B. FIGS. 5A and 5B respectively show steps of supplying another lead frame, and forming and removing a package in a resin sealing method of the present embodiment. As shown in FIG. 5A, in the present embodiment, resin tape 17 is provided over the mold face of lower mold 2.

Referring to FIG. 5A, resin tape 17 is brought closer to or in contact with the mold face of lower mold 2. Thus, resin tape 17 is preheated by heat radiated or transferred from the mold face of lower mold 2 which has been preliminarily heated by a heater (not shown).

Then, after lead frame 11 with semiconductor chip 15 is sucked, lead frame 11 is moved above resin tape 17. Thereafter, lead frame 11 is lowered by chuck 25 and placed on lower mold 2 through resin tape 17. Then, the steps of closing of the molds, pouring of the molten resin (not shown) into cavity 9, and opening of the molds are sequentially performed as in the first embodiment. Here, the molten resin pressed by plunger 5 pours into cull 7 through an opening 29 of lead frame 11.

As shown in FIG. 5B, chuck 25 is downwardly moved to a position below upper mold 1, and a resin mold part 23 tightly in contact with upper mold 1 is ejected by an ejector pin 10, which is then sucked by chuck 25 and transported for example to a tray. After the suction of resin mold part 23, ejector pin 10 is elevated to its original position. The foregoing steps complete resin sealing of one lead frame 11.

In the present embodiment, formation of a cured resin protrusion on the non-mounting surface of lead frame 11, i.e., the bottom surface of the completed package can be prevented as in the first embodiment. In addition, adhesion strength between external electrode 24 and a pad of a printed circuit board of the like increases in mounting the package to the printed circuit board or the like, thereby facilitating visual inspection. Further, since the resin tape needs not be preliminarily applied to the non-mounting surface of lead frame 11, a material cost can be restrained.

Note that an adhesive tape 28 used in the second embodiment may be used as resin tape 17. In this case, as in the second embodiment, adhesion strength between external electrode 24 and the pad of the printed circuit board or the like further increases.

Note that, in the above mentioned embodiments, before supplying the unused portion of resin tape to the space between upper mold 1 and lower mold 2, a vacuum pump or the like may be used to evacuate the space. In this case, evacuation removes foreign matters with air from the surface where the lead frame and resin tape are in contact with each other, so that formation of a cured resin protrusion on the bottom surface of the package can be more effectively prevented. In addition, since foreign matters would not enter the molten resin, more reliable package can be obtained.

In each of the above described embodiments, one lead frame 11 has two semiconductor chips 15. The invention is not limited to this and can also be applied to the case where one lead frame has one semiconductor chip.

In addition, the present invention is applicable to the case where the lead frame has three or more semiconductor chips or semiconductor chips arranged in a matrix. In these cases, workability of resin sealing increases.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A resin sealing method of a semiconductor chip for sealing a semiconductor chip mounted on one surface of a lead frame with a resin using a mold for resin sealing, comprising the steps of:

supplying and setting said lead frame in a prescribed position on a mold face of said mold and enclosing said semiconductor chip in said lead frame in said cavity formed in said mold;

supplying a film with a required heat resistance and elasticity between opposing mold faces of said mold and applying said film on said mold face on the other surface side of said lead frame of said opposing mold faces;

closing said opposing mold faces of said mold;

filling a molten resin material in said cavity after said closing step for sealing said semiconductor chip in said cavity with a resin;

opening said mold and taking out a mold part after said resin sealing step; and removing said film, said lead frame having a required degree of freedom of not being pressed by said opposing mold faces of said mold, and said other surface of lead frame being in close contact with said film applied to said other surface by a pressure of pouring said molten resin material into said cavity.

2. A resin sealing method of sealing a lead frame with a semiconductor chip with a resin using an upper mold and a lower mold opposite to each other, comprising the steps of:

supplying a resin tape bridging from a supplying roll to a receiving roll between said upper and lower molds;

applying said resin tape over a mold face of said upper mold;

placing said lead frame on a mold face of said lower mold to position said semiconductor chip in a cavity of said lower mold;

closing said upper and lower molds while preventing said lead frame from being held between said upper and lower molds, whereby said lead frame has a required degree of freedom of not being pressed by said mold faces of said upper and lower molds;

pouring a molten resin into said cavity and pressing said lead frame against said upper mold through said resin tape by said poured molten resin, whereby said resin tape is applied to a surface of said lead frame by a pressure of pouring said molten resin into said cavity;

curing said molten resin to form a cured resin;

opening said upper and lower molds;

removing a resin mold part having said cured resin and said lead frame integrated together; and supplying unused portion of said resin tape between said upper and lower molds while winding used portion of said resin tape onto said receiving roll by using said receiving roll and said supplying roll.

3. The resin sealing method according to claim 2, wherein said resin tape is preheated by preliminarily heating said upper or lower mold in said step of applying said resin tape.

4. The resin sealing method according to claim 2, wherein said resin tape is an adhesive tape having a base layer and an adhesion layer, said lead frame is pressed against said adhesion layer in said pressing step, and said adhesive tape is removed from said lead frame in or after said opening step.

5. The resin sealing method according to claim 2, characterized in that it further comprises the step of evacuating a space between said upper and lower molds.

6. The resin sealing method according to claim 2, characterized in that said lead frame has a plurality of semiconductor chips, said upper mold or lower mold has a plurality of cavities, and said lead frame is pressed against said resin tape by the molten resin poured into each of said cavities in said pressing step.

7. A resin sealing method of sealing a lead frame with a semiconductor chip with a resin using an upper mold and a lower mold opposite to each other, comprising the steps of:

supplying a resin tape bridging from a supplying roll to a receiving roll between said upper and lower molds;

applying said resin tape over a mold face of said lower mold;

placing said lead frame on said resin tape on said lower mold to position said semiconductor chip directly below a cavity of a mold face of said upper mold;

closing said upper and lower molds while preventing said lead frame from being held between said upper and lower molds, whereby said lead frame has a required degree of freedom of not being pressed by said mold faces of said upper and lower molds;

pouring a molten resin into said cavity and pressing said lead frame against said resin tape on said lower mold by the poured molten resin, whereby said resin tape is applied to a surface of said lead frame by a pressure of pouring said molten resin into said cavity;

curing said molten resin to form a cured resin;

opening said upper and lower molds;

removing a resin mold part with said cured resin and said lead frame integrated together; and supplying a new unused portion of said resin tape between said upper and lover molds while receiving a used portion of said resin tape onto said receiving roll by using said receiving roll and said supplying roll.

8. The resin sealing method according to claim 7, wherein said resin tape is preheated by preheating said upper mold or said lower mold in said step of applying said resin tape.

9. The resin sealing method according to claim 7, wherein said resin tape is an adhesive tape having a base layer and an adhesion layer, said lead frame is pressed against said adhesion layer in said pressing step, and said adhesive tape is removed from said lead frame in or after said opening step.

10. The resin sealing method according to claim 7, characterized in that it further comprises the step of evacuating a space between said upper and lower molds.

11. The resin sealing method according to claim 7, wherein said lead frame has a plurality of semiconductor chips, said upper mold or lower mold has a plurality of cavities, and said molten resin is poured into each of said plurality of cavities and said lead frame is pressed against said resin tape by the poured molten resin in each of said plurality of cavities.

12. An apparatus for sealing with resin a lead frame having a first surface with a semiconductor chip mounted thereon, and a second surface opposite said first surface, said apparatus comprising:

a first mold having a mold face with a mold cavity;

a second mold having a mold face arranged to face said mold cavity;

means for supplying an unused portion of a resin tape from a supplying roll along a plane between said first mold and said second mold;

means for applying said unused portion of said resin tape onto said mold face of said second mold;

means for placing said lead frame between said first mold and said second mold, with said semiconductor chip facing into said mold cavity and said second surface of said lead frame in contact with said resin tape;

means for closing said first mold and said second mold relative to each other while preventing said lead frame from being held between said upper mold and said lower mold whereby said lead frame has a required degree of freedom of not being pressed by said mold faces of said first and second molds, and for opening said first mold and said second mold relative to each other;

means for pouring a molten resin into said cavity and thereby pressing said lead frame against said mold face of said second mold with said resin tape interposed therebetween whereby said resin tape is applied to a surface of said lead frame by a pressure of pouring said molten resin into said cavity, and then curing said molten resin to form a cured resin therefrom;

means for removing a molded part including said cured resin and said lead frame integrated together; and means for removing a used portion of said resin tape from said plane between said first mold and said second mold onto a receiving roll.

13. Tire apparatus according to claim 12, further comprising means for evacuating a space between said first mold and said second mold.

14. A method of resin sealing a semiconductor chip mounted on a lead frame, in a mold including a first mold member having a first mold face and a second mold member having a second mold face opposing said first mold face so as to form a mold cavity between said first mold face and said second mold face, said method comprising the steps:

a) providing a frame-mounted chip including a lead frame having opposite first and second surfaces with a semiconductor chip mounted on said first surface of said lead frame, and positioning said frame-mounted chip between said first mold face and said second mold face with said semiconductor chip oriented toward said first mold face and received in said mold cavity;

b) arranging a polymer film between said first mold face and said second mold face, with said polymer film contacting or directly adjacent to said second mold face without initially contacting said polymer film onto said lead frame;

c) after said steps a) and b), closing said first and second mold members relative to each other so as to enclose said frame-mounted chip in said mold cavity, while leaving a degree of freedom of said frame mounted chip in said mold cavity between said first mold face and said polymer film so that said frame-mounted chip is not pressed by said opposing first and second mold faces and can move in said mold cavity;

d) after said step c), injecting molten resin into said cavity such that said molten resin moves and pushes said frame-mounted chip against said polymer film on said second mold face, such that said polymer film is applied to said second surface of said lead frame by a pressure of said injecting of said molten resin into said cavity, and such that said resin covers and seals said semiconductor chip on said first surface of said lead frame in said mold cavity;

e) solidifying said molten resin to form solidified resin; and f) opening said first and second mold members relative to each other and removing therefrom said frame-mounted chip sealed with said solidified resin.

15. The method according to claim 14, wherein said degree of freedom comprises a gap in a range from 0.03 mm to 0.04 mm.

16. The method according to claim 14, further comprising heating said second mold member and transferring heat from said second mold face to said polymer film so as to heat said polymer film in said step b).

* * * * *